United States Patent [19]
Koizumi

[11] Patent Number: 5,386,129
[45] Date of Patent: Jan. 31, 1995

[54] POWER SUPPLY SYSTEM OF SEMICONDUCTOR CHIP FOR OPTIMIZING IMPEDANCES OF POWER SUPPLY SUB-SYSTEMS ASSOCIATED WITH OUTSIDE AND INSIDE FUNCTION BLOCKS

[75] Inventor: Yuuji Koizumi, Tokyo, Japan

[73] Assignee: NEC Corporation, Tokyo, Japan

[21] Appl. No.: 941,528

[22] Filed: Sep. 8, 1992

[30] Foreign Application Priority Data

Sep. 13, 1991 [JP] Japan ................... 3-235058

[51] Int. Cl.6 .................... H01L 27/02; H01L 27/10; H01L 27/15
[52] U.S. Cl. .................... 257/207; 257/202; 257/210; 257/691
[58] Field of Search ........ 257/207, 208, 211, 202–203, 257/210, 691

[56] References Cited

U.S. PATENT DOCUMENTS

| | | | |
|---|---|---|---|
| 4,811,073 | 3/1989 | Kitamura et al. | 257/207 |
| 4,914,503 | 4/1990 | Shirato et al. | |
| 5,083,181 | 1/1988 | Yoshida et al. | |

FOREIGN PATENT DOCUMENTS

| | | | |
|---|---|---|---|
| 136888 | 4/1985 | European Pat. Off. | |
| 61-20349 | 1/1986 | Japan | 257/208 |
| 2-58377 | 2/1990 | Japan | 257/211 |

Primary Examiner—J. Carroll

[57] ABSTRACT

A power supply system of a semiconductor integrated circuit device is broken down into an outer power supply sub-system associated with an outside function block and an inner power supply sub-system associated with an inside function block, and is implemented by more than three loop wirings extending between the outside function block and the inside function block, wherein first conductive blocks and second conductive blocks are selectively coupled with the more than three loop wirings for providing the outer and inner power supply sub-systems so that impedances of the outer and inner power supply sub-systems are optimized by changing the numbers of the loop wirings.

8 Claims, 4 Drawing Sheets

POWER SUPPLY SYSTEM OF SEMICONDUCTOR CHIP FOR OPTIMIZING IMPEDANCES OF POWER SUPPLY SUB-SYSTEMS ASSOCIATED WITH OUTSIDE AND INSIDE FUNCTION BLOCKS

FIELD OF THE INVENTION

This invention relates to a semiconductor integrated circuit and, more particularly, to a layout of the power supply system incorporated in the semiconductor integrated circuit.

DESCRIPTION OF THE RELATED ART

Various component circuits are integrated on a semiconductor chip for fabricating a semiconductor integrated circuit, and electric power is distributed to the component circuits through a power supply system. The layout of a prior art power supply system is illustrated in FIG. 1, and the component circuits are broken down into an inside function block I and outside function blocks 2 with respect to the power supply system. Conductive corner blocks 3a, 3b, 3c and 3d are provided at four corners of the semiconductor chip, and the power supply system is implemented by a relatively thick outer loop wiring 4a and a relatively thin inner loop wiring 4b. Four pads 5a, 5b, 5c and 5d at the corners are assigned to external electric power, and are coupled with the conductive corner blocks 3a to 3d, respectively. The four conductive corner blocks 3a to 3d are coupled with the relatively thick outer loop wiring 4a, and the electric power is distributed from the relatively thick outer loop wiring 4a to the outside function blocks 2.

On the other hand, the relatively thin inner loop wiring 4b is coupled through through-holes 6 with conductive blocks 7a and 7b, and the pads 5a to 5d supply the electric power to the conductive blocks 7a and 7b. As a result, the electric power is supplied from the pads 5a to 5d through the conductive blocks 7a and 7b to the relatively thin inner loop wiring 4b, and the relatively thin inner loop wiring 4b distributes the electric power to the inside function block 1.

Since the widths of the outer and inner loop wirings 4a and 4b are fixed to predetermined values, respectively, the impedances between the pads 5a to 5d and the outside and inside function blocks 1 and 2 are hardly optimized in view of electric power consumption between the inside function block 1 and the outside function block 2 as well as noises riding thereon. Of course, it is possible to change the mask pattern for the outer and inner loop wirings 4a and 4b. However, the change of the widths affects the total layout of the semiconductor integrated circuit, and is extremely expensive.

SUMMARY OF THE INVENTION

It is therefore an important object of the present invention to provide a power supply system which is flexible to optimize the impedances between pads and inside and outside function blocks without sacrifice of production cost.

To accomplish the object, the present invention proposes to distribute more than three loop wirings to outer and inner power supply sub-systems with first and second coupling means selectively coupled with the more than three loop wirings.

In accordance with the present invention, there is provided a power supply system incorporated in a semiconductor integrated circuit having an outside function block and an inside function block and fabricated on a semiconductor chip, comprising: a) at least three wiring loops extending between the inside function block and the outside function block, and isolated from one another; b) a first coupling means selectively coupling with at least three wiring loops, and providing an outer power supply sub-system for supplying electric power to the outside function block; and c) a second coupling means selectively coupling with at least three wiring loops, and providing an inner power supply sub-system isolated from the outer power supply system for supplying electric power to the inside function block, the first and second coupling means being isolated from each other, external electric power being supplied to the outer and inner power supply sub-systems.

BRIEF DESCRIPTION OF THE DRAWINGS

The features and advantages of the power supply system according to the present invention will be more clearly understood from the following description taken in conjunction with the accompanying drawings in which.

DESCRIPTION OF THE PREFERRED EMBODIMENTS

First Embodiment

Figure 1:
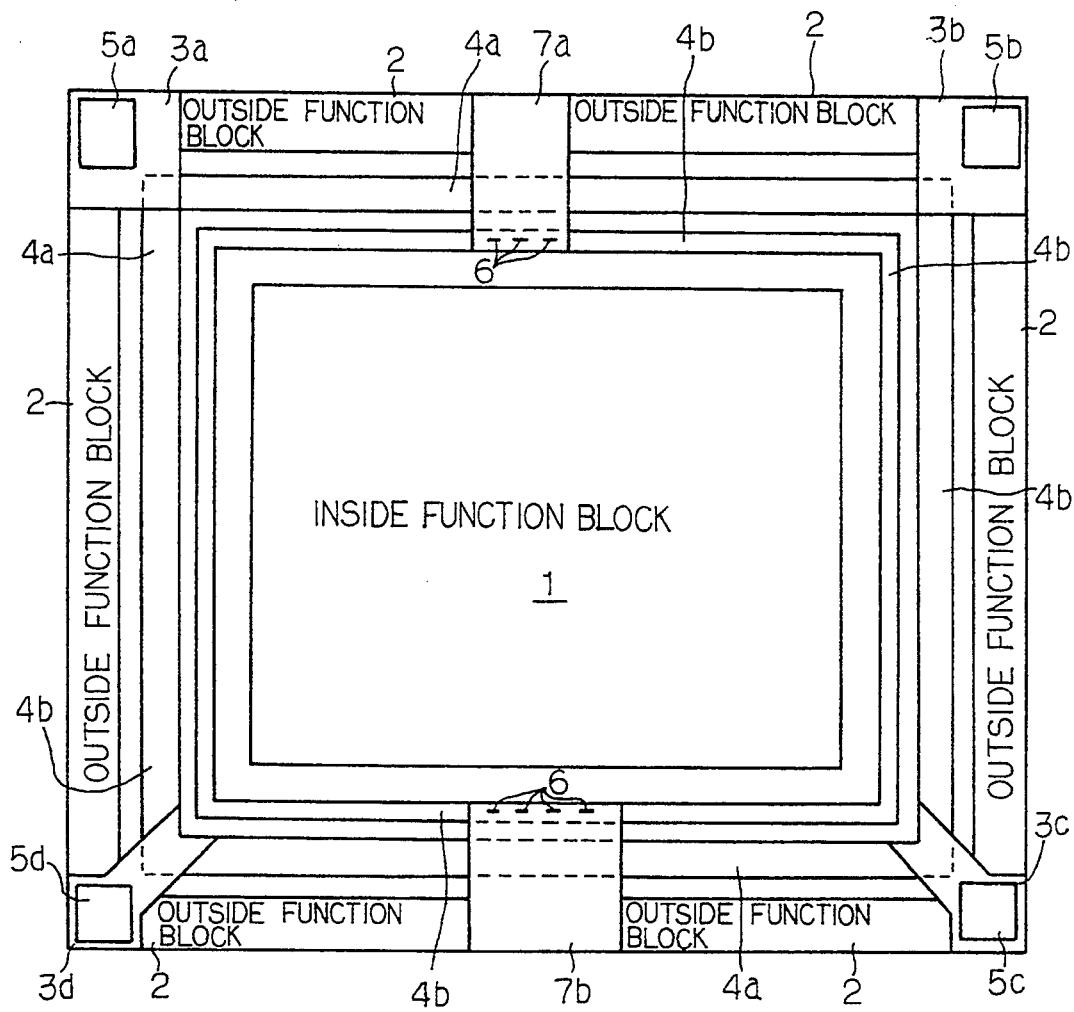
FIG. 1 is a view showing the layout of the prior art power supply system.
Figure 2:
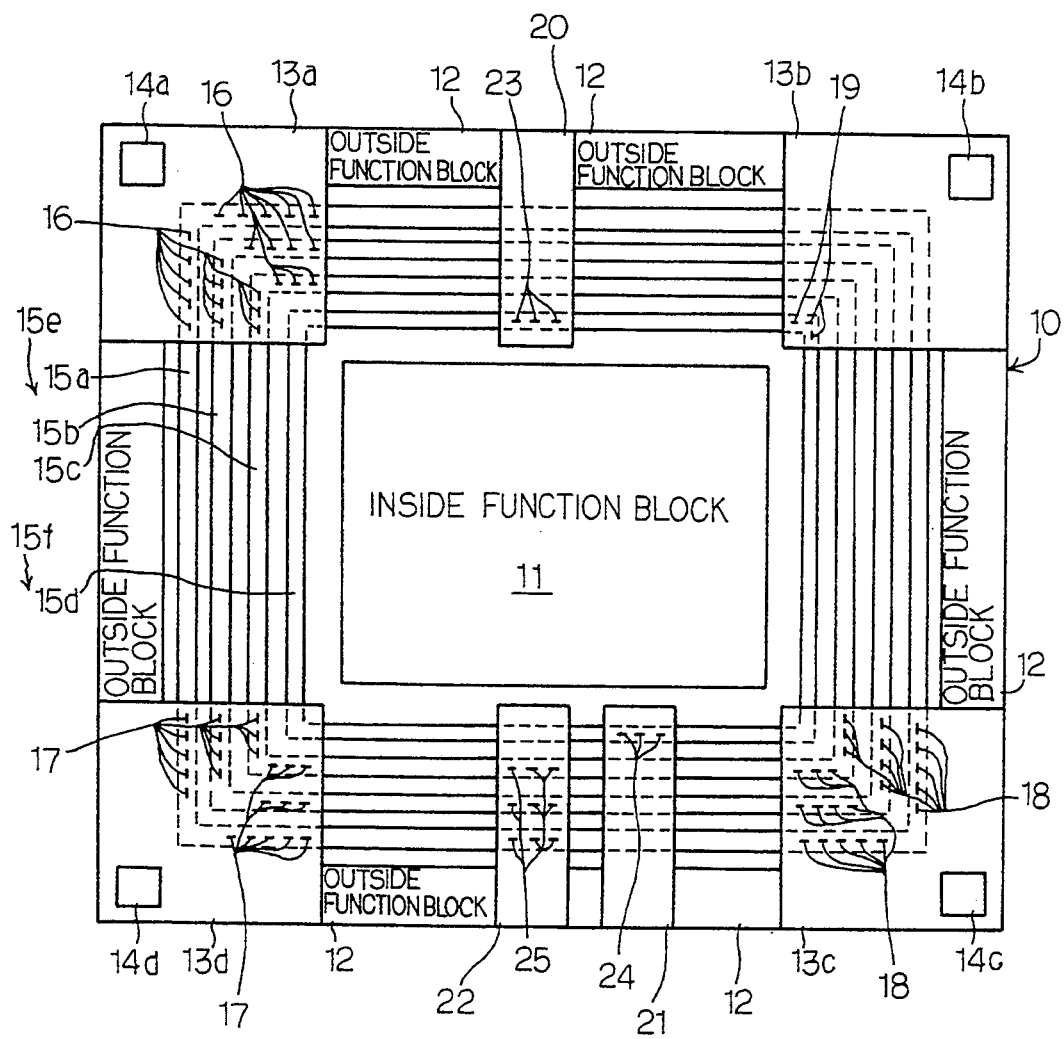
FIG. 2 is a view showing the layout of a power supply system according to the present invention.

Referring to FIG. 2 of the drawings, a semiconductor integrated circuit is fabricated on a single semiconductor chip 10, and component circuits of the semiconductor integrated circuit are broken down into an inside function block 11 and outside function blocks 12 with respect to a power supply system. Conductive corner blocks 13a, 13b, 13c and 13d are provided at four corners of the semiconductor chip 10, and are coupled with pads 14a, 14b, 14c and 14d, respectively. Between the inside function block 11 and the outside function blocks 12 extend four loop wiring strips 15a, 15b, 15c and 15d which are distributed to an outer power supply sub-system 15e and an inner power supply sub-system 15f. In this instance, the loop wiring strips 15a to 15c form in combination the outer power supply system 15e for the outside function blocks 12, and the loop wiring strip 15d serves as the inner power supply sub-system 15f for the inside function block 11. The loop wiring strips 15a to 15d are isolated from one another, and an inter-level insulating film is provided between the conductive corner blocks 13a to 13d and the loop wiring strips 15a to 15d. The loop wirings 15a to 15c of the outer power supply sub-system 15e are coupled through through-holes 16, 17 and 18 in the inter-level insulating film with the conductive corner blocks 13a, 13c and 13d, and the loop wiring strip 15d or the inner power supply sub-system 15f is coupled through through-holes 19 in the inter-level insulating film with the conductive corner block 13b. Three conductive blocks 20, 21 and 22 are further provided on the inter-level insulating film, and are coupled with the pads 14a to 14d. The conductive blocks 20 and 21 are coupled with the loop wiring strip 15d through respective through-holes 23 and 24 formed in the inter-level insulating film, and the conductive block 22 is coupled with the loop wiring strips 15a to 15c through through-holes 25 formed in the inter-level insulating film. External electric power is supplied from the pads 14a, 14c and 14d through the conductive corner blocks 13a, 13c and 13d and the conductive block 22 to the loop wiring strips 15a to 15c, and the loop wiring strips 15a to 15c supply the electric power to the outside function blocks 12. The external electric power is further supplied from the conductive corner block 13b and the conductive blocks 20 and 21 to the loop wiring strip 15d which in turn supplies the electric power to the inside function block 11. In this instance, the through-holes 16 to 18 and 25, the conductive corner blocks 13a, 13c and 13d and the conductive block 22 as a whole constitute a first coupling means, and the through-holes 19, 23 and 24, the conductive corner block 13b and the conductive block 21 form in combination a second coupling means.

The through-holes 16 to 19 and 23 to 25 are formed in the inter-level insulating film through a lithographic process, and a photo-mask is used for the through-holes 16 to 19 and 23 to 25 in the lithographic process. However, if the photo-mask for the through-holes 16 to 19 and 23 to 25 is changed to another photo-mask with different pattern, the four loop wiring strips 15a to 15d can be evenly divided between the outer power supply sub-system 15e and the inner power supply sub-system 15f, and the impedances of the outer and inner power supply sub-systems 15e and 15f are modified without any change of the layout. Thus, only the photo-mask for the through-holes changes the number of the loop wiring strips of the outer power supply sub-system 15e, and, accordingly, the power supply system according to the present invention can optimize the impedances without sacrifice of production cost. The optimized impedances prolong the service time period of the outer and inner power supply sub-systems 15e and 15f.

Second Embodiment

Figure 3:
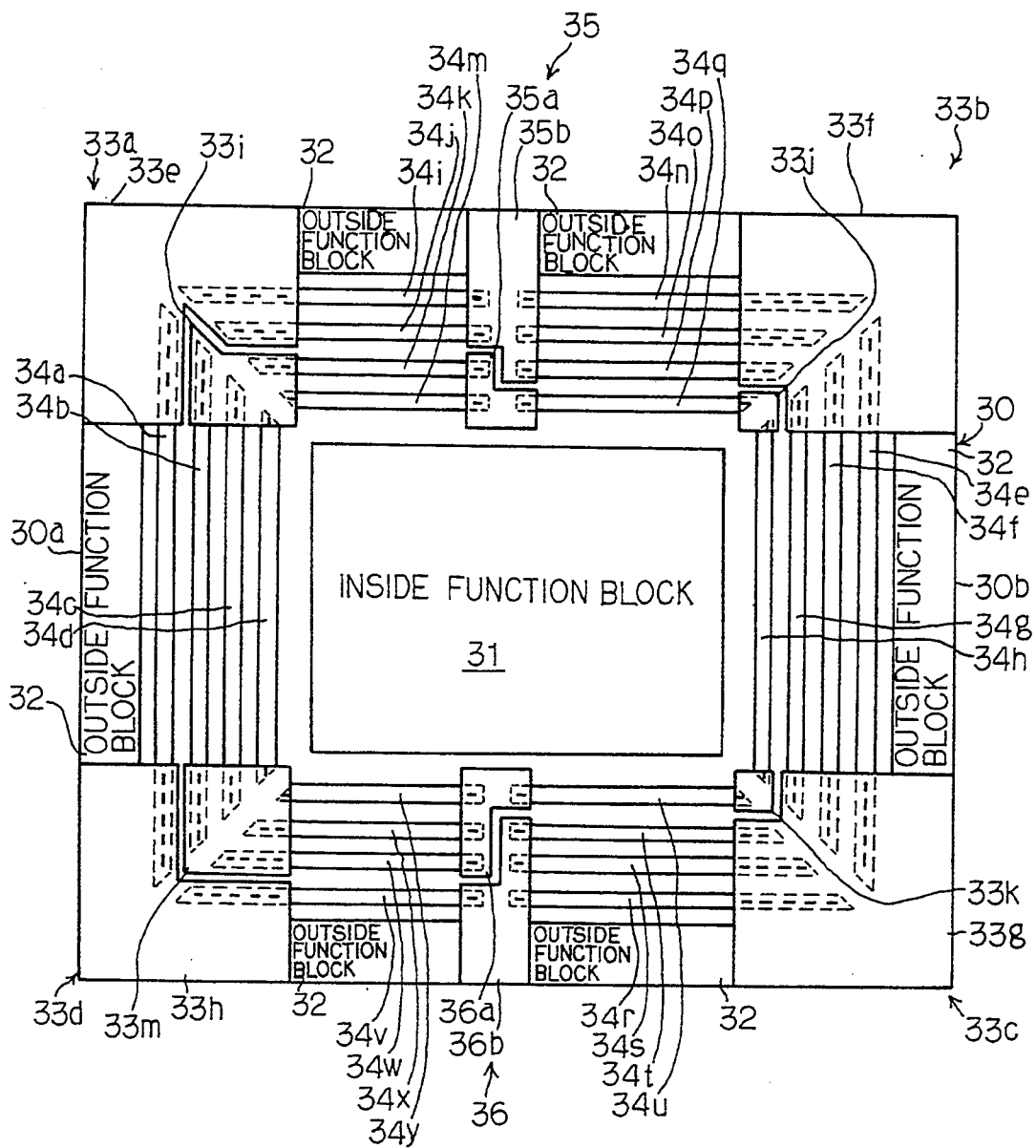
FIG. 3 is a view showing the layout of another power supply system according to the present invention.

Turning to FIG. 3 of the drawings, another semiconductor integrated circuit is fabricated on a single semiconductor chip 30, and component circuits of the semiconductor integrated circuit are broken down into an inside function block 31 and outside function blocks 32 with respect to a power supply system. Conductive corner blocks 33a, 33b, 33c and 33d are provided at four corners of the semiconductor chip 30, and are separated into outer sub-blocks 33e, 33f, 33g and 33h and inner sub-blocks 33i, 33j, 33k and 33m. The conductive corner blocks 33a to 33d or the outer sub-blocks 33e to 33h and the inner sub-blocks 33i to 33m are coupled with pads (not shown), and external electric power is supplied to the outer and inner sub-blocks 33e to 33h and 33i to 33m. Relatively long wiring strips 34a, 34b, 34c and 34d, and 34e, 34f, 34g and 34h are formed between the inside function block 31 and the outside function blocks 32 in parallel to both edges 30a and 30b of the semiconductor chip 30, and both ends of each of the relatively long wiring strips 34a to 34h are located below the conductive corner blocks 33a to 33d. Relatively short wiring strips 34i, 34j, 34k, 34m, 34n, 34o, 34p, 34q, 34r, 34s, 34t, 34u, 34v, 34w, 34x and 34y are also provided between the inside function block 31 and the outside function blocks 32 in parallel to the remaining edges of the semiconductor chip 30. The relatively short wiring strips 34i to 34m are aligned with and spaced from the relatively short wiring strips 34n to 34q, respectively. Similarly, the relatively short wiring strips 34r to 34u are aligned with and spaced from the relatively short wiring strips 34v to 34y, respectively. The relatively short wiring strips 34i to 34y have respective end portions located below the conductive corner blocks 33a to 33d. The relatively long wiring strips 34a and 34e and the relatively short wiring strips 34i, 34n, 34r and 34v form in combination the outermost loop wiring, and the relatively long wiring strips 34d and 34h and the relatively short wiring strips constitute the innermost loop wiring. In the similar manner, the remaining relatively long wiring strips 34b/34f and 34c/34g and the remaining short wiring strips 34j/34o/34s/34w and 34k/34p/34t/34x form two loop wirings. Two conductive blocks 35 and 36 are provided over the relatively short wiring strips 34i to 34y, and are fabricated from inner sub-blocks 35a and 36a and the outer sub-blocks 35b and 36b isolated from each other. Though not shown in FIG. 3, an inter-level insulating film is provided between the relatively long and short wiring strips 34a to 34y and the conductive blocks 33a to 33d, 35 and 36. The other end portions of the relatively short wiring strips 34i to 34y are located below the conductive blocks 35 and 36.

The power supply system is broken down into an outer power supply sub-system for supplying electric power to the outside function block 32 and an inner power supply subsystem for supplying electric power to the inside function block 31. In this instance, the relatively long wiring strips 34a and 34e to 34g and the relatively short wiring strips 34i, 34j, 34n, 34o and 34p as a whole constitute the outer power supply sub-system, and the relatively long wiring strips 34b to 34d and 34h and the relatively short wiring strips 34k, 34m and 34q form in combination the inner power supply sub-system. In order to form the outer power supply sub-system, the outer sub-blocks 33e, 35b, 33f, 33g, 36b and 33h interconnect the relatively long and short wiring strips 34a, 34i, 34j, 34n, 34o, 34p, 34e, 34f, 34g, 34r, 34s, 34t and 34v through through-holes formed in the inter-level insulating film. Similarly, the inner sub-blocks 33i, 35a, 33j, 33k, 36a and 33m interconnect the relatively long and short wiring strips 34b, 34c, 34d, 34k, 34m, 34q, 34h, 34u, 34w, 34x and 34y through through-holes formed in the inter-level insulating film so as to form the inner power supply sub-system. Short dash lines stand for the through-holes formed in the inter-level insulating film in FIG. 3, and the through-holes are formed by using a photo-mask in a lithographic process. The outer and inner sub-blocks 33e to 33h/35b/36b and 33i to 33m/35a/36a are also patterned by using another photo-mask in the subsequent lithographic process. For this reason, if the photo-masks are changed, the outer power supply sub-system is fabricated from different wiring strips. However, even if the component wiring strips of the outer power supply system are changed, the layout of the relatively long and short wiring strips 34a to 34y is unchanged, and the production cost of the semiconductor integrated circuit is not so increased.

Since the total width of the outer power supply system is variable at the conductive corner blocks 33a to 33d and at the conductive blocks 35 and 36, the impedance of the outer power supply sub-system is exactly optimized rather than the first embodiment, and the service time period is prolonged.

Third Embodiment

Figure 4A:
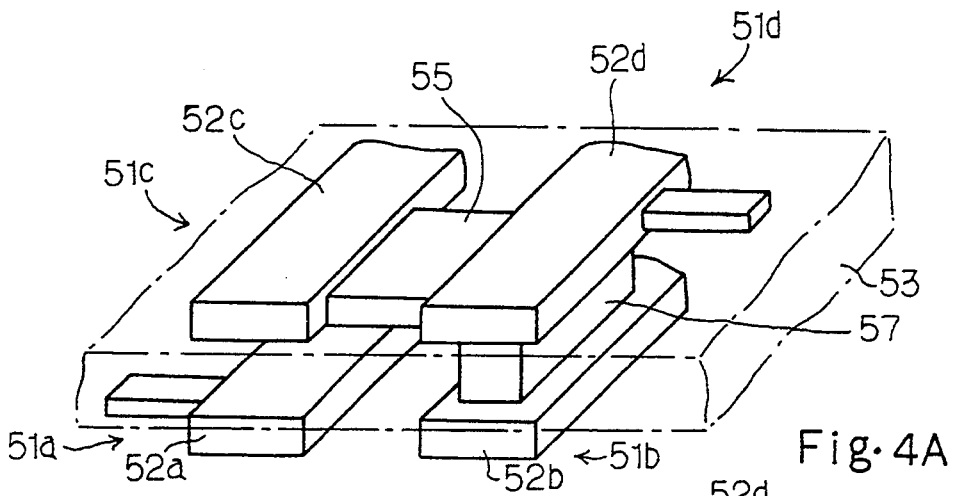
FIGS. 4A to 4C are perspective views showing structures of yet another power supply system according to the present invention.
Figure 4B:
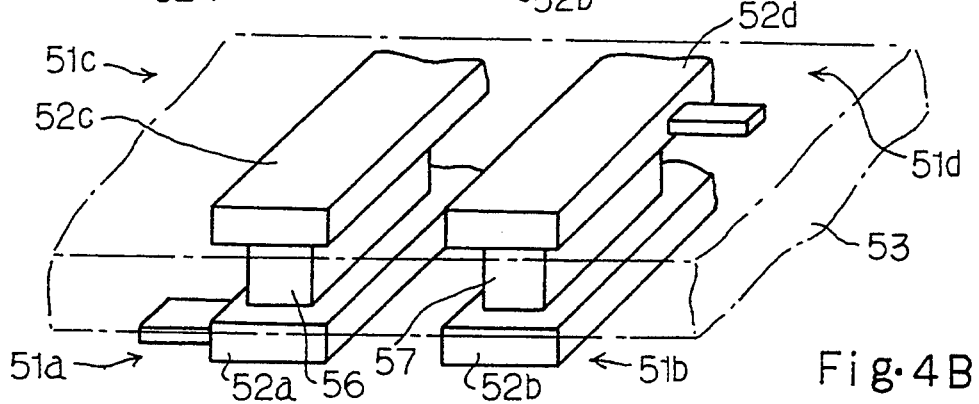
Figure 4C:
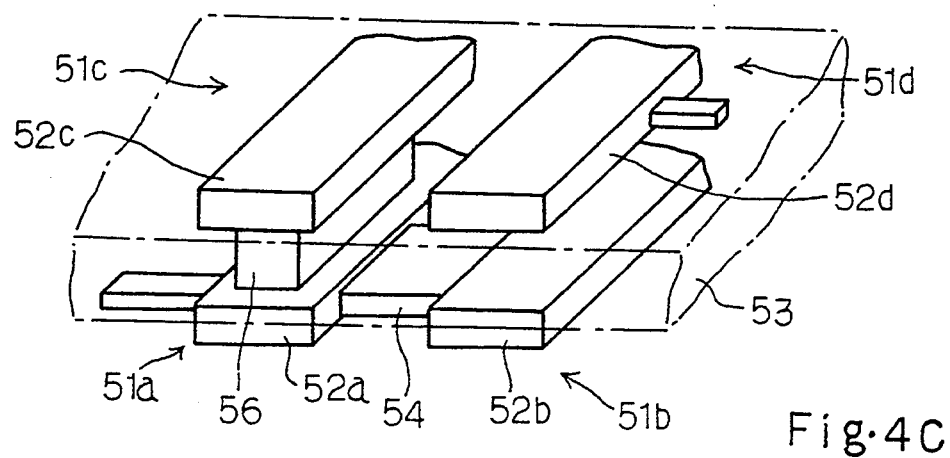

Turning to FIGS. 4A to 4C of the drawings, essential parts of yet another semiconductor integrated circuit are illustrated. The layout of the semiconductor integrated circuit shown in FIGS. 4A to 4C is similar to that of the second embodiment except for two-level structure of wiring loops as well as first and second coupling means. Namely, lower level wiring loops 51a and 51b and upper level wiring loops 51c and 51d are provided for inside and outside function blocks (not shown), and these wiring loops 51a to 51d are formed by short wiring strips including short wiring strips 52a, 52b, 52c and 52d. An inter-level insulating film 53 is inserted between the lower level wiring loops 51a and 51b and the upper level wiring loops 51c and 51d, and vertical connections and horizontal connections selectively interconnect the short wiring strips so as to form inner and outer power supply sub-systems. If it is necessary to couple the short wiring strips 52a and 52c with the short wiring strips 52b and 52d, respectively, the horizontal connections 54 and 55 are provided therebetween as shown in FIGS. 4C and 4A. In order to couple the short wiring strips 52a and 52b with the short wiring strips 52c and 52d, respectively, the vertical connections 56 and 57 are selectively formed therebetween as shown in FIGS. 4A to 4C. Since the horizontal connections 54 and 55 and the vertical connections 56 and 57 are patterned after the lower-level and upper-level wiring loops 51a to 51d, the interconnections are changed by selecting photo-masks in the later lithographic process. Moreover, all of the short wiring strips are flexibly coupled with one another as similar to those shown in FIGS. 4A to 4C, and the impedances of the inner and outer power supply sub-systems are further optimized rather than the second embodiment.

Although particular embodiments of the present invention have been shown and described, it will be obvious to those skilled in the art that various changes and modifications may be made without departing from the spirit and scope of the present invention. For example, the loop wiring strips may be more than four.

What is claimed is:

1. A power supply system incorporated in a semiconductor integrated circuit having an outside function block and an inside function block and fabricated on a semiconductor chip, comprising:
   a) a plurality of wiring loops arbitrary broken down into an outer wiring loop group and an inner wiring loop group for appropriately distributing external electric power to said outside function block and said inside function block, said outer wiring loop group being isolated from said inner wiring loop group;
   b) conductive corner blocks associated with said plurality of wiring loops and selectively connected with said outer wiring loop group and said inner wiring loop group, said external electric power being supplied through said conductive corner blocks to said outer wiring loop group and said inner wiring loop group; and
   c) a plurality of conductive blocks associated with said plurality of wiring loops and selectively connected between said outer wiring loop group and said outside function block and between said inner wiring loop group and said inside function block.

2. A power supply system incorporated in a semiconductor integrated circuit having an outside function block and an inside function block and fabricated on a semiconductor chip, comprising:
   a) more than three wiring loops extending between said inside function block and said outside function block and isolated from one another, wherein an arrangement of said more than three wiring loops is fixed and available for another semiconductor circuit;
   b) a first coupling means selectively coupled with said more than three wiring loops for providing an outer power supply sub-system, said outer power supply sub-system being operative to supply electric power to said outside function block; and
   c) a second coupling means coupled with at least one predetermined wiring loop selected from said more than three wiring loops for providing an inner power supply sub-system isolated from said outer power supply sub-system, said inner power supply sub-system being operative to supply electric power to said inside function block, said first and second coupling means being isolated from each other, external electric power being supplied to said outer and inner power supply sub-systems, said more than three wiring loops being divided between said outer power supply sub-system and said inner power supply sub-system for appropriately distributing said external electric power to said outside function block and said inside function block.

3. A power supply system as set forth in claim 2, in which said outer power supply sub-system is implemented by outer wiring loops selected from said more than three wiring loops, and said inner power supply sub-system is implemented by said at least one predetermined wiring loop of said more than three wiring loops.

4. A power supply system as set forth in claim 2, in which said first coupling means comprises a plurality of conductive corner blocks provided over said more than three wiring loops and coupled with said outer wiring loops, and at least one conductive block located over said more than three wiring loops and interconnecting said outer wiring loops.

5. A power supply system as set forth in claim 4, in which said second coupling means comprises at least one conductive corner block located over said more than three wiring loops in spacing relation from said plurality of conductive corner blocks, and coupled with said at least one predetermined wiring loop, and a plurality of conductive blocks located over said more than three wiring loops in spacing relation from said at least one conductive corner block, and coupled with said at least one predetermined wiring loop.

6. A power supply system as set forth in claim 1, in which at least three of said wiring loops are distributed to a lower-level and an upper level, and an inter-level insulating film is provided between said lower-level and said upper level.

7. A power supply system as set forth in claim 6, in which said at least three wiring loops in said lower-level and in said upper-level are implemented by a plurality of short wiring strips, and in which said first coupling means comprises at least one vertical connection coupled between one of said short wiring strips in said lower-level and another of said short wiring strips in said upper-level, and at least one horizontal connection coupled between two of said short wiring strips in either lower or upper level.

8. A power supply system as set forth in claim 2, in which at least three of said wiring loops are implemented by at least three sets of long and short component wiring strips, said long and short component wiring strips being separated from one another, and in which said first coupling means comprises outer sub-blocks of a plurality of conductive corner blocks located over said at least three wiring loops and interconnecting a set of long and short component wiring strips of an outer wiring loop of said at least three wiring loops and long and short component wiring strips of other sets of component long and short component wiring strips, and outer sub-blocks of a plurality of conductive blocks located over said at least three wiring loops and interconnecting the short component wiring strips of said outer wiring loop and short component wiring strips of the other sets of long and short component wiring strips, said second coupling means comprising inner sub-blocks of said plurality of conductive corner blocks interconnecting a set of long and short component wiring strips of an inner wiring loop of said at least three wiring loops and other long and short wiring strips of other sets of long and short component wiring strips, and inner sub-blocks of said plurality of conductive blocks interconnecting the short wiring strips of said inner wiring loop and the other short wiring strips of the other sets of long and short component wiring strips.

* * * * *